United States Patent

[11] 3,615,940

[72] Inventor Ki Dong Kang
Phoenix, Ariz.
[21] Appl. No. 809,555
[22] Filed Mar. 24, 1969
[45] Patented Oct. 26, 1971
[73] Assignee Motorola, Inc.
Franklin Park, Del.

[54] METHOD OF FORMING A SILICON NITRIDE DIFFUSION MASK
2 Claims, 4 Drawing Figs.

[52] U.S. Cl. .......... 148/187
[51] Int. Cl. .......... H01l 7/44
[50] Field of Search .......... 148/187; 117/212; 156/17

[56] References Cited
UNITED STATES PATENTS
3,438,873 4/1969 Schmidt .......... 156/17
3,472,689 10/1969 Scott, Jr. .......... 117/212

*Primary Examiner*—Hyland Bizot
*Attorney*—Mueller and Aichele

ABSTRACT: A method of forming a silicon nitride diffusion mask on the surface of a semiconductor wafer is described. The method utilizes the steps of depositing a relatively low-density silicon nitride film at temperatures in the range of 450° to 750° C. and etching the low-density film with a low-temperature hydrogen fluoride etch. The density of the silicon nitride mask is increased by heating it to a temperature of about 900° to 1,000° C. The densification takes place during the diffusion of impurities into the wafer since a diffusion step normally utilizes temperatures in the range of 800° to 1,300° C.

INVENTOR.
Ki Dong Kang
BY
Mueller, Aichele & Rauner
Attys

METHOD OF FORMING A SILICON NITRIDE DIFFUSION MASK

BACKGROUND OF THE INVENTION

This invention relates to diffusion masks for semiconductor bodies and, in particular, to a method of forming a silicon nitride diffusion mask.

In the manufacture of semiconductor devices such as integrated circuits, the electrical characteristics of a pure semiconductor material are deliberately changed by introducing impurity atoms into its atomic structure. The substitution of impurity atoms for the semiconductor atoms in the pure crystal structure is generally referred to as doping. One method utilized for the introduction of impurity atoms into a wafer involves placing the wafer in a furnace and heating it to a relatively high temperature, for example 800° C to 1,200° C., and then subjecting the wafer to a gas flow containing a heavy concentration of impurity atoms. In another commonly used diffusion method, the surface of the original semiconductor wafer is coated with a layer of impurity material. When the wafer is subsequently heated, the impurity atoms penetrate the wafer and replace some of the atoms in the original material.

In the fabrication of integrated circuits, it is necessary to locate the impurities in certain precisely defined regions of a wafer. This selective diffusion is accomplished through the use of a series of masks which protect portions of the wafer against unwanted impurity penetrations. One masking material that has been found to be substantially immune to penetration by selected impurities at standard diffusion temperatures is silicon dioxide. While this material is widely used throughout the semiconductor industry, it is used with the recognition that silicon dioxide creates problems in the manufacture of the devices as well as serving as a suitable masking material for a limited number of impurities. In particular, silicon dioxide is not suitable for use as a mask in the case of gallium diffusions. Further, it has long been recognized that mobile impurities generally found in silicon dioxide film results in the formation of channels in a region underneath the film. A channel is an area underlying the silicon dioxide film which has been inverted from one type of conductivity to the opposite type due to the presence of changes either within or on top of the silicon dioxide film. This inversion layer has been found to form an extension of a particular region within the wafer, generally the base region of a transistor, to the unpassivated edges of the structure and results in a change in the characteristics of the device. While the mechanism by which these channels are formed is not fully understood, the presence of these channels is known to degrade the device performance.

Accordingly, considerable effort is being directed to the development of suitable masking materials which do not exhibit or induce the channeling effects heretofore common in the use of silicon dioxide film. One of the primary candidates for replacing silicon dioxide in the manufacture of semiconductor devices is silicon nitride. A silicon nitride film on the surface of the wafer provides good protection against penetration by impurity atoms and, therefore, provides the necessary passivation. However, the use of a silicon nitride film in commercial manufacturing processes has been found to be relatively difficult in that the film requires a high-temperature etch, normally phosphoric acid, at temperatures in excess of 100° C. This is in marked contrast to silicon dioxide which can be etched at relatively low temperatures, for example room temperatures, with commercially available hydrogen fluoride etching agents.

The difficulty experienced in the etching of silicon nitride film has prevented widespread application of this type of film in the semiconductor industry. This is due primarily to the fact that photosensitive material or photoresist is utilized in the formation of masks which control the selective etching of the passivating films. The photolithographic techniques utilized in making semiconductor devices generally rely on first coating the entire surface of the wafer with the masking film which can be utilized in the completed structure as a passivating film. Then, the surface of the passivating film is covered with a thin film of photoresist. The selective exposure of areas of the photoresist stabilizes or fixes selected areas. The entire coated wafer is then immersed in a solution which removes the unexposed photoresist uncovering the passivating film in these regions. The fixed photoresist film remains on the surface of the passivating film and is not affected by this solution.

Upon the completion of the formation of the photoresist mask, the wafer is subjected to an etching solution which attacks and removes the uncovered passivating film but cannot penetrate the fixed photoresist. As a result, the passivating film is removed only in those areas which subsequently are to have impurities diffused therein. After etching, the fixed photoresist is removed and the wafer is ready for the introduction of the impurities. Since the etching of silicon nitride has heretofore required high temperatures and phosphoric acid, it has been found that this type of film use of silicon mask cannot be readily etched without disturbing the fixed photoresist.

One method of utilizing a silicon nitride mask relies on the presence of an overlying silicon dioxide film which is selectively etched in the conventional manner to form a mask for the subsequent etching of the silicon nitride film. The silicon dioxide mask approach adds several additional steps to the fabrication process and is thus both time consuming and expensive.

Consequently, it is an object of the present invention to provide a method of forming a silicon nitride mask which is both compatible with the etching and photoresist materials presently utilized in manufacturing processes and eliminate several steps required in present methods directed to forming silicon nitride films. In particular, this invention is directed to a method of forming a silicon nitride film wherein the film can be selectively etched by commercially available fluoride etches at relatively low temperatures. A further object of this invention is to provide a method of forming a silicon nitride film that permits selective etching of the film without degrading the adhesion of the photoresist material contained on its surface.

SUMMARY OF THE INVENTION

The present method is a series of steps to be utilized in the manufacture of semiconductor devices of the type having impurity atoms selectively introduced into a surface thereof. These steps include depositing a film of silicon nitride, characterized by a low density, on the surface of the semiconductor body. This deposition occurs at a relatively low temperature, within the range of 450° to 750° C., and results in a low-density film wherein the binding force between atoms is relatively low.

After the low-density film has been formed on the appropriate surface of the semiconductor body, the film is selectively etched to delineate a desired masking pattern. The selective etching may include the steps of covering the low-density film with a photoresistive material, exposing same and removing the unexposed portions of the photoresist.

In addition, this step includes etching the silicon nitride so that portions thereof not covered by the photoresist are removed and the corresponding surface areas of the semiconductor body exposed. When this step has been completed, the relatively low-density silicon nitride film has the particular geometry desired. However, the low density of this film renders it generally less effective than high-density film for passivation in that impurity atoms can penetrate a low-density film and enter the semiconductor body. To this end, the silicon nitride film is heated to a temperature higher than the deposition temperature after selectively being etched to increase the density thereof and improve the masking properties. Typically, this step involves heating the semiconductor body and film thereon to a temperature of about 900° C. In practice, the selectively etched film is densified during the diffusion process since, typically, diffusion temperatures are about 900° C.

The present process provides a silicon nitride diffusion mask with conventional low-temperature fluoride etching procedures and without disturbing or altering the photoresist pattern formed thereon. In addition, the process is found to be especially compatible with the emitter washout technique utilized in the fabrication of high frequency semiconductor devices The emitter washout process has been recognized as being useful in the fabrication of transistors wherein the width of the emitter region is to be minimized. Briefly, the process utilizes the same aperture in the diffusion mask for both the emitter region and the emitter contact formation. In this connection, the present method is utilized to form a densified silicon nitride mask for the emitter diffusion. During the diffusion process, a silicon dioxide film is grown on the exposed surface portions of the wafer. Then, the conventional low-temperature hydrogen fluoride etches are utilized to remove the silicon dioxide from the original aperture in the silicon nitride film to permit the formation of the emitter contact on the surface of the emitter region. Due to the fact that the width of the emitter region approaches the limit of resolution of commercially available photolithographic techniques, the emitter contact has the same area. Since the silicon nitride film has been densified and is substantially resistance to fluoride etches at this time, the possibility of undercutting the passivating film and exposing the emitter-base junction in the removal of the oxide on the surface of the emitter region is essentially eliminated. This advantage of the present process is obtained even in structures wherein a thin, for example 500 Angstrom, silicon dioxide film is interposed between the wafer and the silicon nitride film since only a small surface area of this silicon dioxide film is exposed to etchant.

Further features and advantages of the invention will become more readily apparent from the following detailed description of a preferred embodiment of the invention, when taken in conjunction with the accompanying drawings.

BRIEF DESCRIPTION OF THE PREFERRED EMBODIMENT

Figure 1:
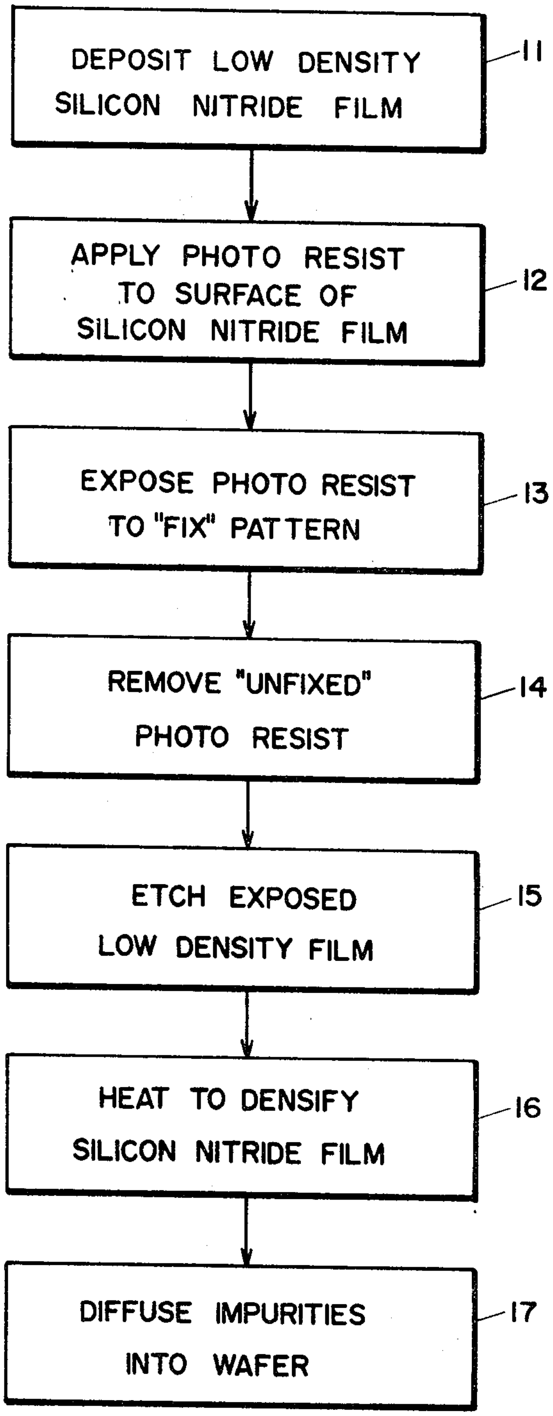
FIG. 1 is a simplified flow chart showing a process utilizing the steps of the present invention .

Referring now to FIG. 1, process step 11 includes the deposition of a low-density silicon nitride film on the surface of the semiconductor wafer being processed. While the following description will refer to a silicon wafer, it will be recognized that other types of substrates may be utilized including a silicon wafer having an oxide layer previously formed thereon.

The low-density silicon nitride film is formed by vapor deposition within a reaction chamber. One vapor phase reaction which may be employed to form the silicon nitride film utilizes the reaction between ammonia $NH_3$ and either silicon tetrachloride $SiCl_4$ or silane $SiH_4$ at elevated temperatures. Previously, silicon nitride films were formed at high temperatures of the order of 900° to 1,000° C. in order to insure that the silicon nitride film exhibited the desired passivating properties. In other words, previous methods were directed to providing a high-density film of silicon nitride so that the film would protect against the introduction if impurities into the underlying semiconductor material.

The present process utilizes in step 11 a low-temperature vapor deposition which insures that the film formed has a relatively low density. The temperatures utilized in the present method to form a low-density silicon nitride film are within the range of 450° to 750° C. The wafer is maintained at these temperatures for a period of 10 to 20 minutes. In one application of the present process found to be especially well suited for the formation of phosphorus doped emitter regions in silicon devices, the temperature for deposition was 650° C. and was maintained for 20 minutes to form a 2,000-Angstrom silicon nitride from $NH_3$ and $SiCl_4$. The time is determined by the desired thickness of the silicon nitride film. In practice, the thickness is within the range of 500 to 2,000 Angstroms.

When the low-density silicon nitride film is formed upon the surface of the wafer, photoresist or photosensitive material is uniformly applied to the surface of the silicon nitride film. This is shown in FIG. 1 as step 12. The application of the photoresist material is a step well-known in the art and takes place when the wafer is removed from the reaction chamber. To insure a uniform coverage of the photoresist film, it is common practice to place the wafer on a vacuum chuck and add a drop of photoresist to the center of the wafer. The chuck spins at a relatively high speed to distribute photoresist evenly over the wafer surface. Then, a mask, usually glass, containing an opaque printed pattern of the areas into which impurities are to be introduced is secured over the wafer and the structure is exposed to ultraviolet light. This is shown in FIG. 1 as step 13. This light "fixes" the resist in all areas of the wafer except those covered by the opaque pattern of the mask. The entire wafer is then sprayed with or immersed in a solution which removes the unexposed photo-resist in step 14. This uncovers the silicon nitride film in these regions. The fixed photoresist film is not affected by the solution and remains on the surface of the low-density film. In this process, either positive or negative photoresist can be employed if desired.

Next, the wafer and silicon nitride layer thereon is subjected to an etching solution which attacks and removes the uncovered silicon nitride film but cannot penetrate the fixed photoresist. The silicon nitride film, therefore, is removed only in those areas which subsequently are to have impurities diffused therein. The etching medium in this case is preferably a low temperature commercially available hydrogen fluoride etch. The properties of these HF etches are well-known due to their widespread use in the fabrication of semiconductor devices.

The fact that the silicon nitride film in the present process is of relatively low density wherein the binding force between atoms is relatively low enables the film to be selectively etched without going to high temperatures. Previously, attempts to utilize silicon nitride as a passivating film have intentionally employed a high-density film wherein the atoms are tightly bound. As a result, the silicon nitride film could not be readily removed by the low-temperature etchants presently employed in the manufacture of semiconductor devices. Instead, the dense silicon nitride film required a phosphoric acid etch at relatively high temperatures in excess of 100° C. The combination of phosphoric acid and high temperature was found to adversely affect the photoresist. In particular, the photoresist was found to lift off the surface of the dense silicon nitride film at these high temperatures.

After the low-density film has been etched in the present process to expose the desired portions of the underlying semiconductor wafer, the film is subjected to a densifying step shown as 16 in FIG. 1. In the densifying step, the binding force between atoms in the film is increased by heating to a temperature higher than the deposition temperature in order to provide a film having passivating properties needed for retarding the introduction of impurities into the underlying material. This step may be performed prior to the diffusion step or may utilize the high temperature required by the diffusion process. In practice, the silicon nitride film is densified within the diffusion reaction chamber during the diffusion process. The heating step adds energy to the silicon nitride film and increases the binding force of the atoms therein. As a result, the passivating qualities of the silicon nitride film insure that essentially no impurity atoms penetrate therethrough to the surface of the semiconductor wafer.

Figure 2:
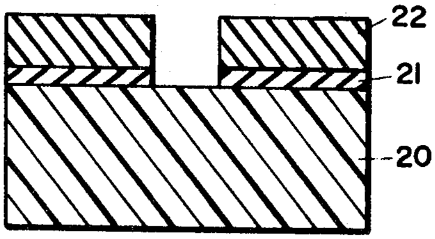
FIGS. 2 through 4 are sectional views of a series of steps in the emitter washout process of fabricating a high-frequency semiconductor device.
Figure 3:
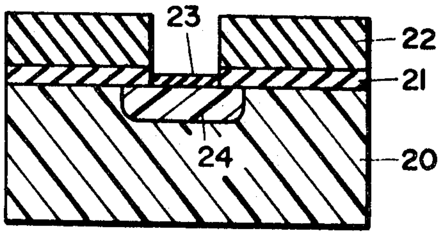
Figure 4:
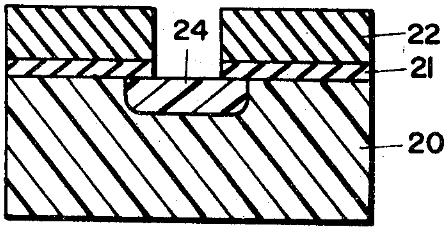

The present process has been found especially useful in performing the emitter washout technique utilized in the manufacture of high-frequency transistors. Since it is recognized that the width of the emitter region of a transistor should be minimized for high-frequency usage, the emitter region width is normally made as small as the available photolithographic techniques permit. The typical resolution limit is about 2 microns. Due to the fact that the emitter region is diffused through the smallest practical aperture in the passivating layer, the emitter contact must be formed using the same aperture. In this connection, FIG. 2 shows a semiconductor wafer 20 having a dense silicon nitride film 22 formed on top of a relatively thin, for example 500 Angstrom, oxide layer 21. An aperture is shown in film 22 and layer 21. Underlying this aperture and extending laterally under the film 22 is emitter region 24. This shallow region has been diffused through the aperture with the impurity atoms moving laterally as well as vertically to form region 24. As shown in FIG. 3, after the completion of the emitter diffusion during which time the silicon nitride film has been densified, the exposed portion of the surface of the wafer is covered with silicon dioxide layer 23 formed during the high-temperature diffusion as a by-product thereof. The material in the aperture of film 22 is then etched as shown in FIG. 4 to free this aperture for the formation of the emitter contact therein. Due to the fact that the densified silicon nitride film 22 is resistant to HF etches, the silicon dioxide layer 23 can be etched and removed without exposing the base-emitter junction of the transistor. The danger of exposing the junction due to the undercutting of silicon dioxide film 21 is essentially eliminated since the overlying silicon nitride film minimizes the exposed portion of film 21. While not drawn to scale, the relative thickness of the films in FIG. 4 are approximately 3 to 1 with the silicon nitride film 22 about 1,500 Angstroms in thickness and the silicon dioxide films 21 and 23 approximately 500 Angstroms in thickness.

While the above description has referred to a specific embodiment of the invention, it will be recognized that many modifications and variations may be made therein without departing from the spirit and scope of the invention.

I claim:

1. A method for the selective introduction of impurities into a surface of a semiconductor body which comprises the steps of:

a. providing a body of semiconductor material;
b. forming a layer of silicon dioxide over said upper surface;
c. depositing a film of silicon nitride having a relatively low density on the surface of said semiconductor body;
d. selectively etching said film and said silicon dioxide to delineate a desired masking pattern;
e. heating said film to increase the density of the silicon nitride and improve the masking properties thereof; and
f. exposing the masked semiconductor body to said impurities for forming an additional region within said body.

2. In the manufacture of semiconductor devices wherein impurity atoms are selectively introduced into a surface of a semiconductor body, the improvement comprising the steps of:

a. providing a body of semiconductor material having an upper surface and being of a first conductivity-type;
b. forming a layer of silicon dioxide over said upper surface;
c. depositing a film of silicon nitride characterized by a relatively low density on said layer of silicon surface dioxide;
d. selectively etching said film and said silicon dioxide to delineate a desired masking pattern and for exposing a portion of said upper surface of said semiconductor body;
e. heating said silicon nitride film to increase the density thereof and improve the masking and passivating properties of said film;
f. forming by diffusion a region of opposite conductivity-type in said body underlying said exposed upper surface, and said region forming a junction with said body terminating at said upper surface and under said layer of silicon dioxide and simultaneously forming by said step of diffusion a layer of silicon dioxide over said exposed upper surface;
g. etchably removing said last mentioned silicon dioxide film without exposing said junction protected by said layers of silicon dioxide and silicon nitride; and
h. forming an electrical contact adhering to said exposed upper surface.